United States Patent
Chan et al.

[11] Patent Number: 6,002,179
[45] Date of Patent: Dec. 14, 1999

[54] BONDING PAD STRUCTURE FOR INTEGRATED CIRCUIT (I)

[75] Inventors: Chin-Jong Chan, Hsinchu Hsien; Hsiu-Hsin Chung, Kaohsiung; Rueyway Lin, Hsinchu, all of Taiwan

[73] Assignee: Winbond Electronics Corporation, Hsinchu, Taiwan

[21] Appl. No.: 09/039,354

[22] Filed: Mar. 13, 1998

[30] Foreign Application Priority Data

Sep. 15, 1997 [TW] Taiwan ................................. 86113409

[51] Int. Cl.⁶ ....................................................... H01L 23/48
[52] U.S. Cl. .......................... 257/781; 257/786; 257/784; 257/773; 257/774; 257/734; 438/652; 438/614; 438/666
[58] Field of Search ..................................... 257/781, 784, 257/786, 773, 774, 734; 438/614, 652, 666

[56] References Cited

U.S. PATENT DOCUMENTS

| | | | |
|---|---|---|---|
| 5,248,903 | 9/1993 | Heim | 257/748 |
| 5,372,969 | 12/1994 | Moslehi | 438/106 |
| 5,707,894 | 1/1998 | Hsiao | 438/614 |
| 5,723,822 | 3/1998 | Lien | 257/739 |
| 5,736,791 | 4/1998 | Fujiki et al. | 257/781 |

*Primary Examiner*—Tom Thomas
*Assistant Examiner*—Luan Thai
*Attorney, Agent, or Firm*—Fish & Richardson P.C.

[57] ABSTRACT

A bonding pad structure formed on a semiconductor substrate comprises an insulating layer, a conducting pad, a passivation layer, and a buffer layer. The insulating layer is formed on the semiconductor substrate. The conducting pad is formed on the insulating layer, and the passivation layer is formed to cover peripherals of the conducting pad forming an overhang region therebetween. However, the buffer layer is patterned and etched to form a plurality of either islands or openings between the insulating layer and the conducting pad but withon the range of the overhang region. Accordingly, peeling resistance ability can be enhanced via a form of mechanical interlocking. In addition, a portion of the overhang region can be wider than the other portion thereof in order to further intensify the adhesion between the conducting pad and the passivation layer.

22 Claims, 7 Drawing Sheets

BONDING PAD STRUCTURE FOR INTEGRATED CIRCUIT (I)

BACKGROUND OF THE INVENTION

1. Field of the Invention

The present invention generally relates to semiconductor integrated circuit fabrication. In particular, the present invention relates to a bonding pad structure for an integrated circuit, which can enhance peeling resistance ability via mechanical interlocking.

2. Description of the Prior Art

Wedge bonding technologies play a critical role in the fabrication of chip-on-board (COB) circuitry, and have been widely applied to commercial electronic products. With the ongoing progress made by the semiconductor IC fabrication community in the miniaturization of the size of device feature, bonding pads provided for external connections, for example, have been gradually decreased from a layout area of greater than 100 µm×100 µm used previously.

Figure 1:
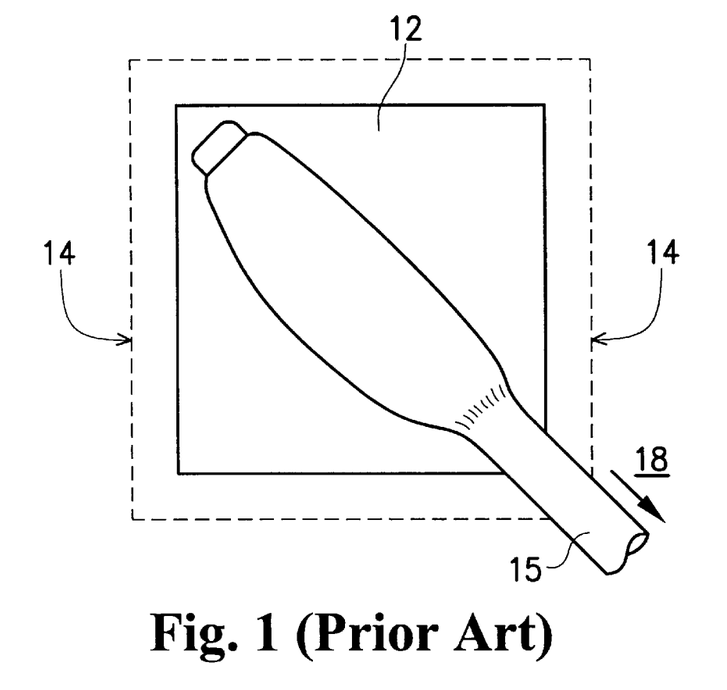
FIG. 1 schematically depicts a conventional bonding pad for an integrated circuit after bonding in a top view.
Figure 2:
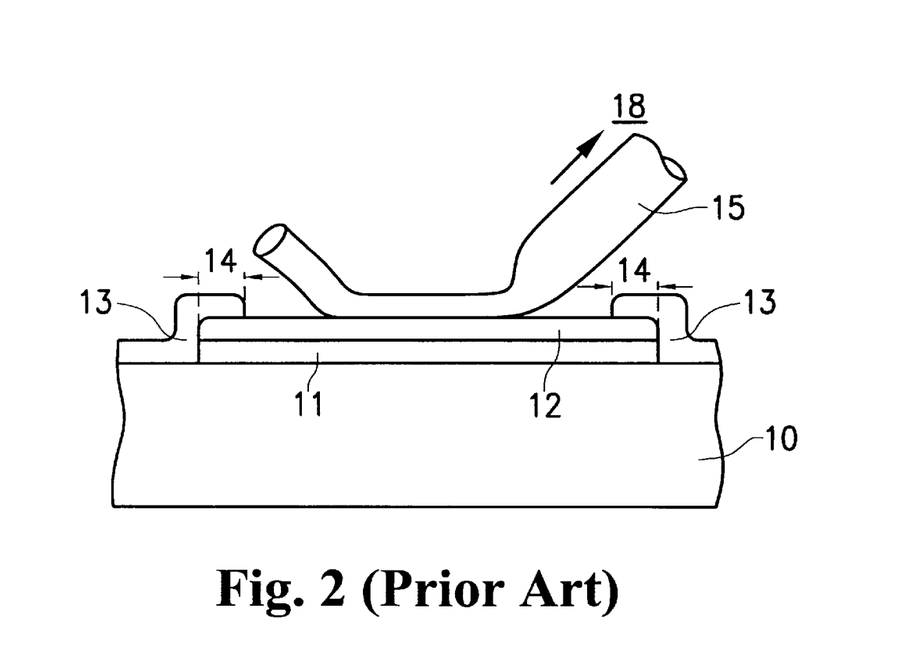
FIG. 2 schematically depicts a cross-sectional view of FIG. 1.

Referring to FIG. 1, a conventional bonding pad for an integrated circuit after being bonded is schematically illustrated in a top view. Moreover, FIG. 2 is the cross sectional view of FIG. 1. The bonding pad shown in FIGS. 1 and 2 is formed on a semiconductor substrate 10, in which lots of electronic devices (not shown in the drawing) have been fabricated. For isolation between a subsequently-formed conducting pad 12 and the devices fabricated in the semiconductor substrate 10, an insulating layer 11 is formed to overlie the semiconductor substrate 10. The conducting pad 12 is thereafter deposited on the insulating layer 11. The insulating layer 11 is further in charge of planarization, the thickness of which should be sufficient and which is usually made of borophosphosilicate glass (BPSG). The conducting pad 12 is preferably a metal layer made of multi-layer material of TiN/Al—Si—Cu/TiN/Ti, and serves the function of transmitting an input signal or an output signal, or tying to a power level or a ground level, etc. Reference numeral 13 designates a passivation layer overlying the semiconductor substrate 10 to prevent scratches or cracking in the internal circuitry. The passivation layer 13 is partially etched away to expose a portion of the conducting pad 12 for wedge bonding. Accordingly, the overhang region between the conducting pad 12 and the passivation layer 13 is referred to numeral 14 in the drawing.

Usually, while the bonding procedure is being performed, one end of a conducting line 15 will first be bonded to the exposed portion of the conducting pad 12 by a wedge bonder. However, another end will be drawn in a direction 18 as shown in FIG. 1 and tied to one bond finger of a lead frame (not shown in the drawing) so as to electrically connect the bonding pad to the associated bond finger.

Nonetheless, although the semiconductor industry has made progress on miniaturization, the wedge bonder used for the chip-on-board fabrication is still restricted in its precision. Therefore, misalignment may occur during bonding and cause damage to the passivation layer 13. Even worse, the force used in drawing the conducting line 15 along in the direction 18 may give rise to peeling and worsens the yield loss.

However, another bonding pad structure has been proposed whereby the width of the overhang region 14 is increased so as to enhance the adhesion between the conducting pad 12 and the passivation layer 13, but the tradeoff and hence the drawback is that layout area is large.

For the foregoing reason, there is a need for a novel bonding pad structure that can withstand peeling while the bonding procedure is performed and also consume less layout area.

SUMMARY OF THE INVENTION

Therefore, an object of the present invention is to provide a bonding pad structure that can resist against peeling via a form of mechanical interlocking.

Another object of the present invention is to provide a bonding pad structure that expends less layout area.

The present invention achieves the above-indicated objects by providing a bonding pad structure formed on a semiconductor substrate, comprising an insulating layer, a conducting pad, a passivation layer, and a buffer layer. The insulating layer is formed on the semiconductor substrate. The conducting pad is formed on the insulating layer, and the passivation layer is formed to cover peripherals of the conducting pad forming an overhang region therebetween. However, the buffer layer is patterned and etched to form several islands or openings between the insulating layer and the conducting pad within the range of the overhang region. Accordingly, peeling resistance ability can be enhanced through a type of mechanical interlocking. In addition, a portion of the overhang region can be wider than the other portion thereof in order to further increase the adhesion between the conducting pad and the passivation layer.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

First Embodiment

Figure 3:
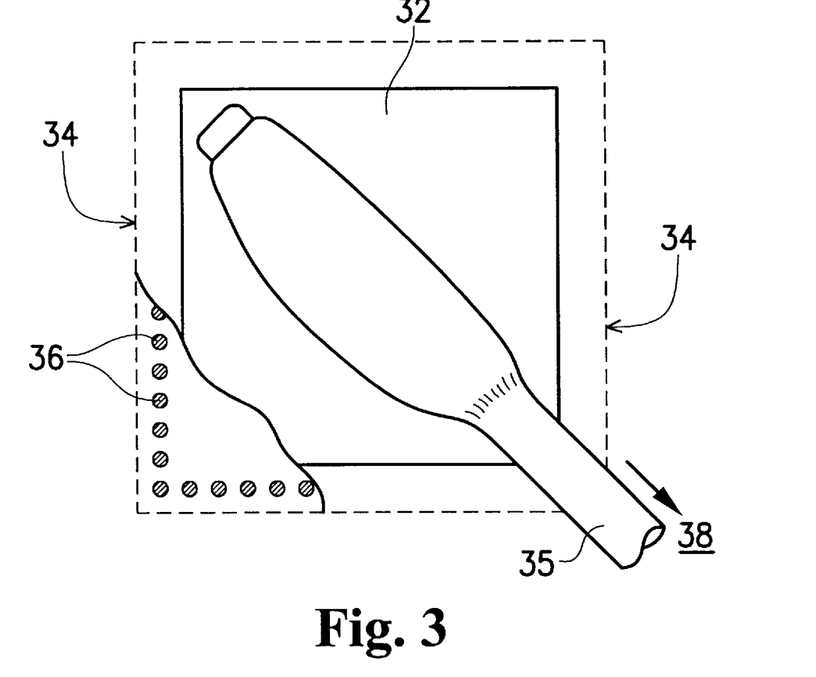
FIG. 3 schematically depicts the first preferred embodiment in accordance with the present invention after bonding in a top view.
Figure 4:
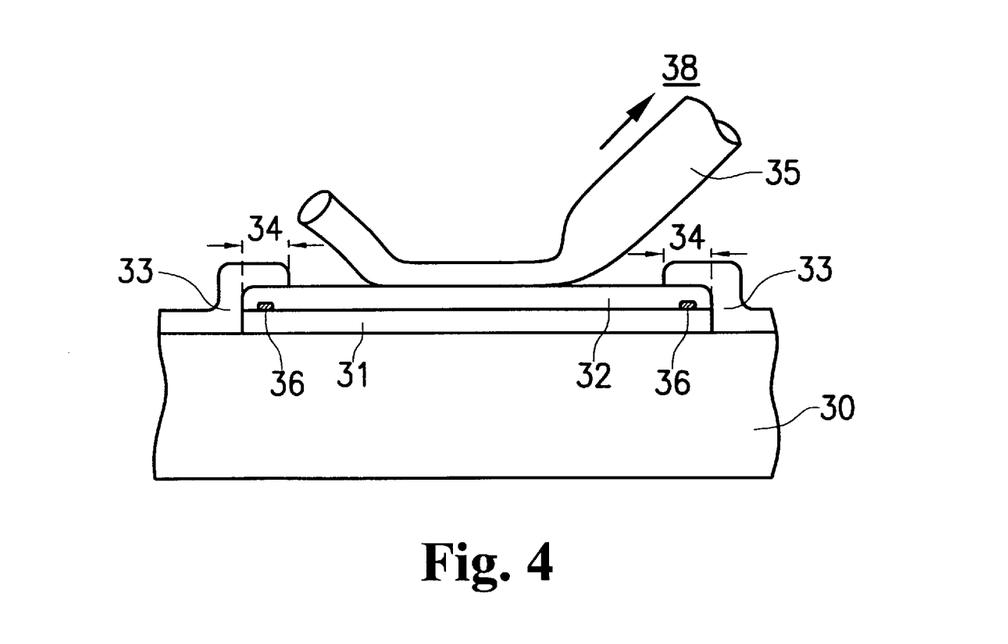
FIG. 4 schematically depicts a cross-sectional view of FIG. 3.

Referring to FIG. 3, the first preferred embodiment in accordance with the present invention after bonding is schematically depicted in a top view. Moreover, FIG. 4 is a cross-sectional view of FIG. 3. The bonding pad shown in FIGS. 3 and 4 is formed over a semiconductor substrate 30, in which lots of devices (not shown in the drawing) have been fabricated.

For isolation between a subsequently-formed conducting pad 32 and the devices fabricated in the semiconductor substrate 30, an insulating layer 31 is formed on the semiconductor substrate 30. The insulating layer 31 is further in charge of planarization, the thickness of which should be sufficient, and which is usually made of borophosphosilicate glass (BPSG). A buffer layer is thereafter formed on the insulating layer 31, and, preferably, the buffer layer may be an undoped polysilicon layer deposited in a low-pressure chemical vapor deposition (LPCVD) reactor. Then, by means of photolithography, the buffer layer is patterned and etched to shape a plurality of islands 36 positioned within the range of an overhang region 34 (which will be described in the following).

Next, the conducting pad 32 is deposited to cover the insulating layer 31 and the islands 36 as well. The conducting pad 32 is preferably a metal layer made of multi-layer material of TiN/Al—Si—Cu/TiN/Ti, which serves the function of transmitting an input signal or an output signal, or tying to a power level or a ground level, etc. Reference numeral 33 designates a passivation layer overlying the semiconductor substrate 30 to prevent scratches or cracking in the internal circuitry. The passivation layer 33 is partially etched away to expose a portion of the conducting pad 32 for wedge bonding. Accordingly, the overhang region between the conducting pad 32 and the passivation layer 33 is referred to by numeral 34 in the drawing.

Usually, during bonding, one end of a conducting line 35 made, for example, of aluminum filaments, is bonded to the exposed portion of the conducting pad 32 by a wedge bonder. However, another end is drawn in a direction 38 as shown in FIG. 3 and tied to one bond finger of a lead frame (not shown in the drawing) so as to electrically connect the bonding pad to the associated bond finger.

In the first preferred embodiment, there are several islands 36 merely positioned between the insulating layer 31 and conducting pad 32 within the range of the overhang region 34. Even if misalignment occurs, while the conducting line 35 is bonded, peeling resistance ability can be increased via a form of mechanical interlocking. Preferably, those islands 36 will have a diameter of from about 0.5 μm to several micrometers, whereas the spacing among the islands 36 will be greater than 0.5 μm. Although circles as shown in FIG. 3 exemplify the islands 36, other shapes such as rectangular, square, triangular, ellipse, polygon, etc., can also be utilized to achieve the objects of the present invention.

Second Embodiment

Figure 5:
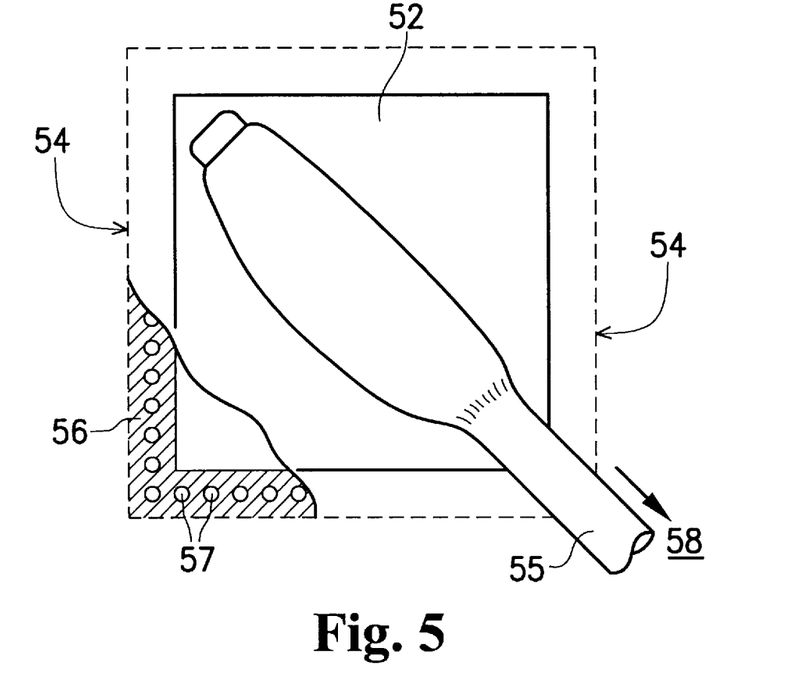
FIG. 5 schematically depicts the second preferred embodiment in accordance with the present invention after bonding in a top view.
Figure 6:
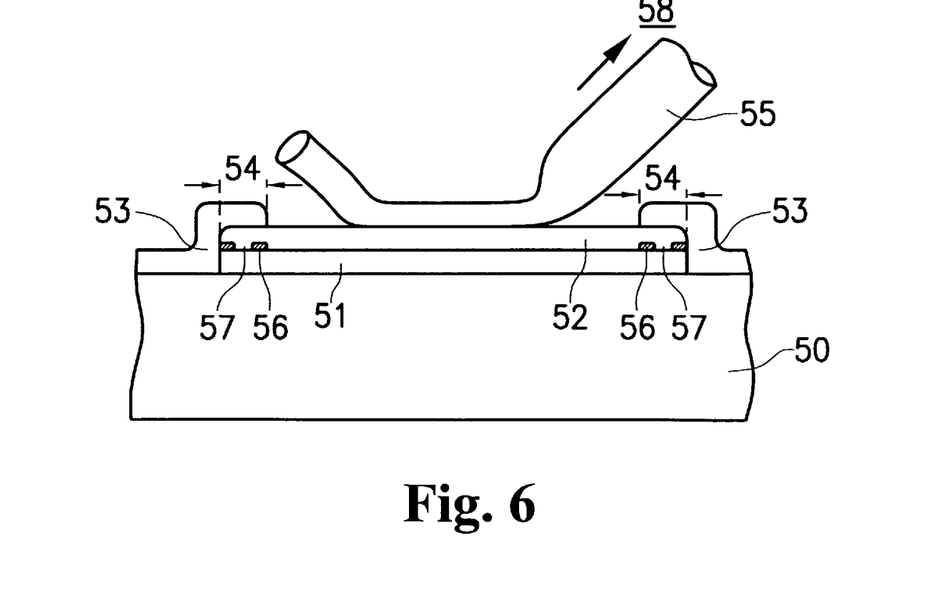
FIG. 6 schematically depicts a cross-sectional view of FIG. 5.

Referring to FIG. 5, the second preferred embodiment in accordance with the present invention after bonding is schematically depicted in a top view. Moreover, FIG. 6 is a cross-sectional view of FIG. 5. The bonding pad shown in FIGS. 5 and 6 is formed over a semiconductor substrate 50, in which lots of devices (not shown in the drawing) have been fabricated.

For isolation between a subsequently-formed conducting pad 52 and the devices fabricated in the semiconductor substrate 50, an insulating layer 51 is formed on the semiconductor substrate 50. The insulating layer 51 is further in charge of planarization, the thickness of which should be sufficient, and which is usually made of borophosphosilicate glass (BPSG). A buffer layer 56 is thereafter formed on the insulating layer 51, and, preferably, the buffer layer 56 may be an undoped polysilicon layer deposited in a low-pressure chemical vapor deposition (LPCVD) reactor. Then, by means of photolithography, the buffer layer 56 is patterned and etched to shape a plurality of openings 57 positioned within the range of an overhang region 54 (which will be described in the following).

Next, the conducting pad 52 is deposited to cover the insulating layer 51 as well as the buffer layer 56, and therefore filled in the openings 57. The conducting pad 52 is preferably a metal layer made of multi-layer material of TiN/Al—Si—Cu/TiN/Ti, which serves the function of transmitting an input signal or an output signal, or tying to a power level or a ground level, etc. Reference numeral 53 designates a passivation layer overlying the semiconductor substrate 50 to prevent scratches or cracking in the internal circuitry. The passivation layer 53 is partially etched away to expose a portion of the conducting pad 52 for wedge bonding. Accordingly, the overhang region between the conducting pad 52 and the passivation layer 53 is referred to numeral 54 in the drawing.

Usually, during bonding, one end of a conducting line 55 made, for example, of aluminum filaments, is bonded to the exposed portion of the conducting pad 52 by a wedge bonder. However, another end is drawn in a direction 58 as shown in FIG. 5 and tied to one bond finger of a lead frame (not shown in the drawing) so as to electrically connect the bonding pad to the associated bond finger.

In the second preferred embodiment, there is a buffer layer 56 formed between the insulating layer 51 and conducting pad 52 within the range of the overhang region 54. The buffer layer 56 is dimpled to shape the openings 57 and the conducting pad 52 is made to fill in those openings 57. Even if misalignment occurs, while the conducting line 55 is bonded, peeling resistance ability can be increased via a form of mechanical interlocking. Preferably, those openings 57 have a diameter of from about 0.5 μm to several micrometers, whereas the spacing among the openings 57 is greater than o.5 μm. Although circles as shown in FIG. 5 exemplify the openings 57, other shapes such as rectangular, square, triangular, ellipse, polygon, etc., can also be utilized to achieve the objects of the present invention.

Third Embodiment

Figure 7:
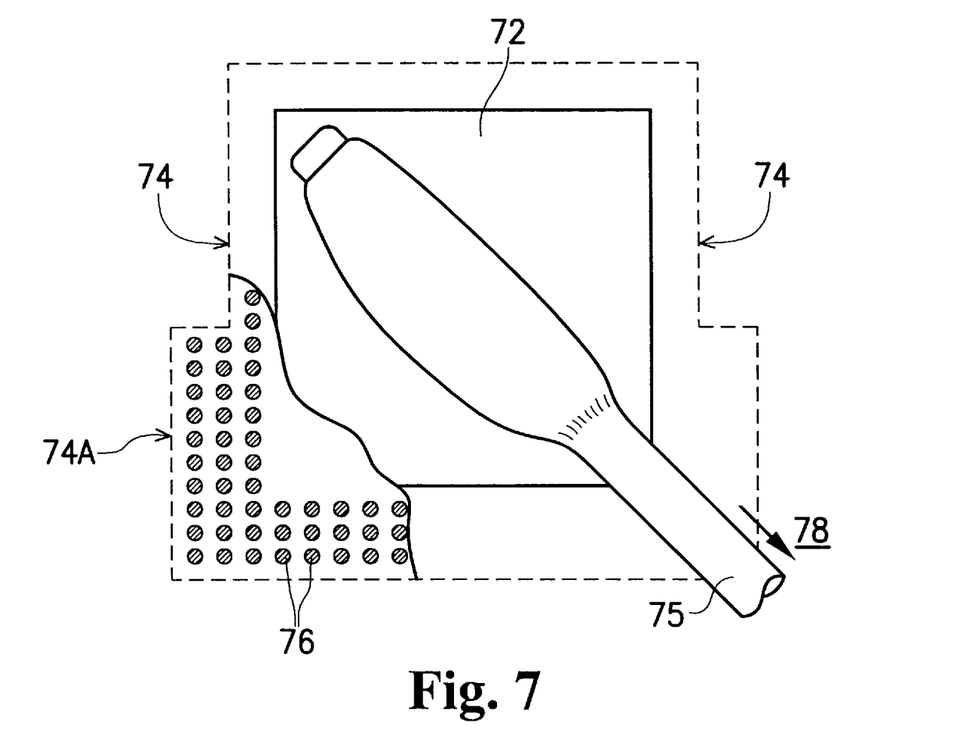
FIG. 7 schematically depicts the third preferred embodiment in accordance with the present invention after bonding in a top view.
Figure 8:
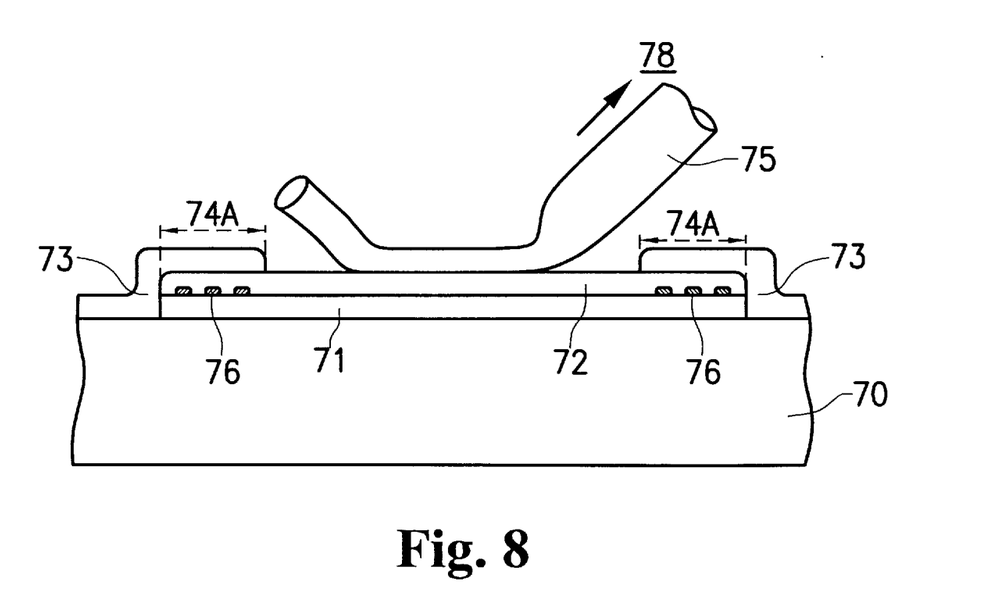
FIG. 8 schematically depicts a cross-sectional view of FIG. 7.

Referring to FIG. 7, the third preferred embodiment in accordance with the present invention after bonding is schematically depicted in a top view. Moreover, FIG. 8 is a cross-sectional view of FIG. 7. The bonding pad shown in FIGS. 7 and 8 is formed over a semiconductor substrate 70, in which lots of devices (not shown in the drawing) have been fabricated.

For isolation between a subsequently-formed conducting pad 72 and the devices fabricated in the semiconductor substrate 70, an insulating layer 71 is formed on the semiconductor substrate 70. The insulating layer 71 is further in charge of planarization, the thickness of which should be sufficient, and which is usually made of borophosphosilicate glass (BPSG). A buffer layer is thereafter formed on the insulating layer 71, and, preferably, the buffer layer may be an undoped polysilicon layer deposited in a low-pressure chemical vapor deposition (LPCVD) reactor. Then, by means of photolithography, the buffer layer is patterned and etched to shape a plurality of islands 76 positioned within the range of an overhang region 74 (which will be described in the following).

Next, the conducting pad 72 is deposited to cover the insulating layer 71 as well as the islands 76. The conducting pad 74 is preferably a metal layer made of multi-layer material of TiN/Al—Si—Cu/TiN/Ti, which serves the function of transmitting an input signal or an output signal, or tying to a power level or a ground level, etc. Reference numeral 73 designates a passivation layer overlying the semiconductor substrate 70 to prevent scratches or cracking in the internal circuitry. The passivation layer 73 is partially etched away to expose a portion of the conducting pad 72 for wedge bonding. Accordingly, the overhang region between the conducting pad 72 and the passivation layer 73 is referred to numeral 74 in the drawing.

Usually, during bonding, one end of a conducting line 75 made, for example, of aluminum filaments, is bonded to the exposed portion of the conducting pad 72 by a wedge bonder. However, another end is drawn in a direction 78 as shown in FIG. 7 and tied to one bond finger of a lead frame (not shown in the drawing) so as to electrically connect the bonding pad to the associated bond finger. Note that a portion of the overhang region 74 close to the drawing direction 78 is wider than the other portion thereof and referred to reference numeral 74A.

In the third preferred embodiment, there are several islands 76 merely positioned between the insulating layer 71 and conducting pad 72 within the range of the overhang region 74. Accordingly, even if misalignment occurs, while the conducting line 75 is bonded, peeling resistance ability can be increased via a form of mechanical interlocking. In addition, the wider portion 74A enhances the adhesion between the conducting pad 72 and the passivation layer 73. Preferably, those islands 76 have a diameter of from about 0.5 μm to several micrometers, whereas the spacing among the islands 76 is greater than 0.5 μm. Although circles as shown in FIG. 7 exemplify the islands 76, other shapes such as rectangular, square, triangular, ellipse, polygon, etc., can also be utilized to achieve the objects of the present invention.

Fourth Embodiment

Figure 9:
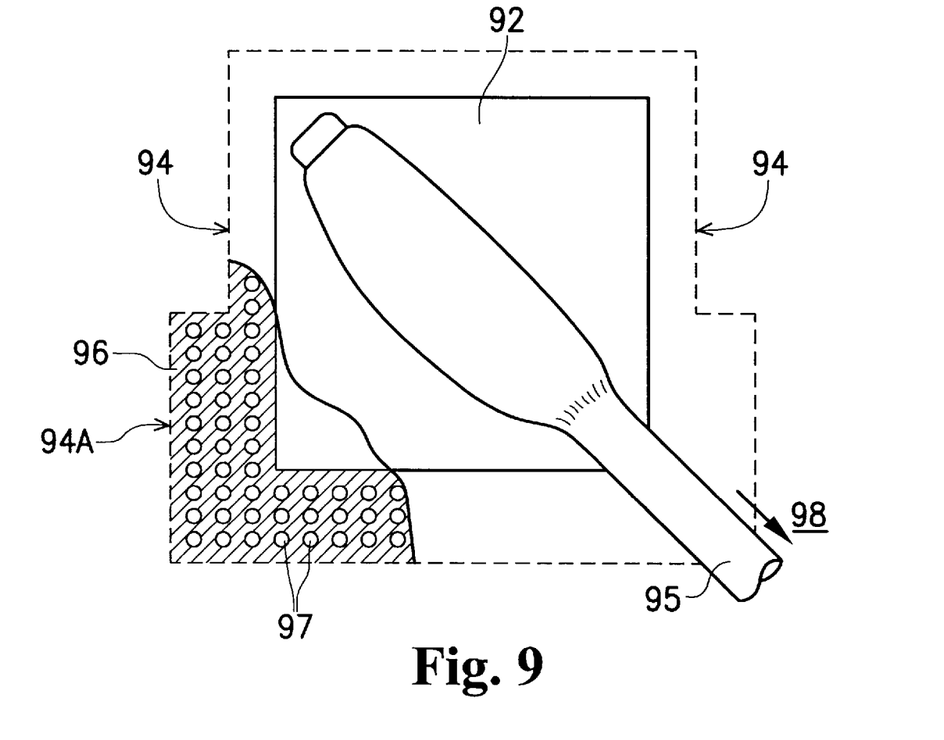
FIG. 9 schematically depicts the fourth preferred embodiment in accordance with the present invention after bonding in a top view.
Figure 10:
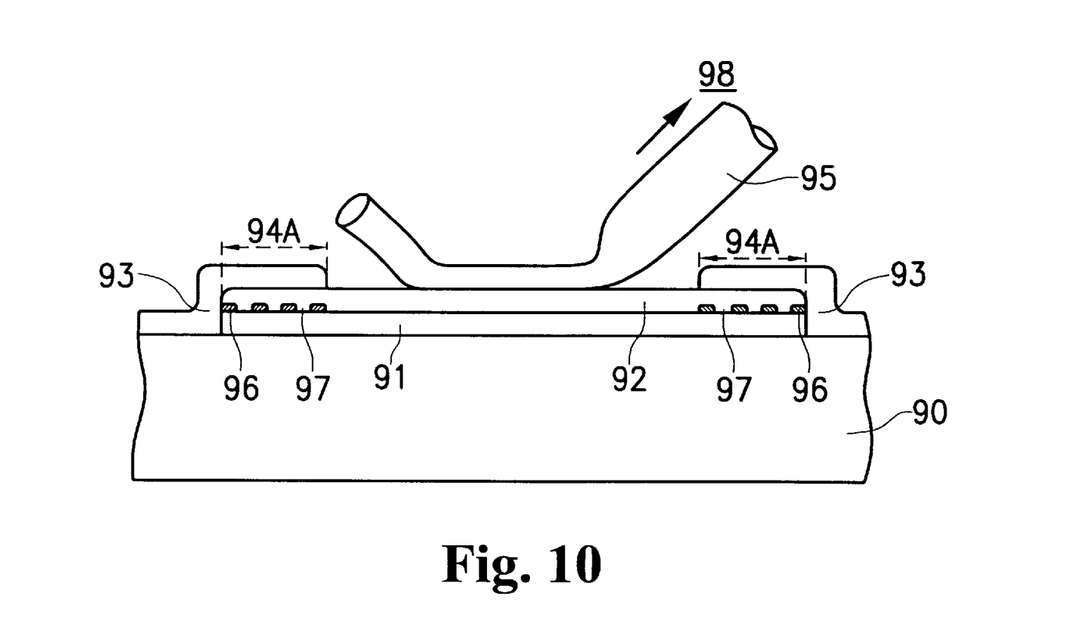
FIG. 10 schematically depicts a cross-sectional view of FIG. 9.

Referring to FIG. 9, the fourth preferred embodiment in accordance with the present invention after bonding is schematically depicted in a top view. Moreover, FIG. 10 is a cross-sectional view of FIG. 9. The bonding pad shown in FIGS. 9 and 10 is formed over a semiconductor substrate 90, in which lots of devices (not shown in the drawing) have been fabricated.

For isolation between a subsequently-formed conducting pad 92 and the devices fabricated in the semiconductor substrate 90, an insulating layer 91 is formed on the semiconductor substrate 90. The insulating layer 91 is further in charge of planarization, the thickness of which should be sufficient, and which is usually made of borophosphosilicate glass (BPSG). A buffer layer 96 is thereafter formed on the insulating layer 91, and, preferably, the buffer layer 96 may be an undoped polysilicon layer deposited in a low-pressure chemical vapor deposition (LPCVD) reactor. Then, by means of photolithography, the buffer layer 96 is patterned and etched to shape a plurality of openings 97 positioned within the range of an overhang region 94 (which will be described in the following).

Next, the conducting pad 92 is deposited to cover the insulating layer 91 and the buffer layer 96 as well, and therefore filled in the openings 97. The conducting pad 92 is preferably a metal layer made of multi-layer material of TiN/Al—Si—Cu/TiN/Ti, which serves the function of transmitting an input signal or an output signal, or tying to a power level or a ground level, etc. Reference numeral 93 designates a passivation layer overlying the semiconductor substrate 90 to prevent scratches or cracking in the internal circuitry. The passivation layer 93 is partially etched away to expose a portion of the conducting pad 92 for wedge bonding. Accordingly, the overhang region between the conducting pad 92 and the passivation layer 93 is referred to numeral 94 in the drawing.

Usually, during bonding, one end of a conducting line 95 made, for example, of aluminum filaments, is bonded to the exposed portion of the conducting pad 92 by a wedge bonder. However, another end is drawn in a direction 98 as shown in FIG. 9 and tied to one bond finger of a lead frame (not shown in the drawing) so as to electrically connect the bonding pad to the associated bond finger. Note that a portion of the overhang region 94 close to the drawing direction 98 is wider than the other portion thereof and referred to reference numeral 94A.

In the fourth preferred embodiment, there is a buffer layer 96 formed between the insulating layer 91 and conducting pad 92 within the range of the overhang region 94. The buffer layer 96 is dimpled to shape the openings 97 in which the conducting pad 92 is filled. Accordingly, even if misalignment occurs, while the conducting line 95 is bonded, peeling resistance ability can be increased via a form of mechanical interlocking. In addition, the wider portion 94A enhances the adhesion between the conducting pad 92 and the passivation layer 93. Preferably, those openings 97 have a diameter of from about 0.5 μm to several micrometers, whereas the spacing among the openings 97 is greater than 0.5 μm. Although circles as shown in FIG. 9 exemplify the openings 97, other shapes such as rectangular, square, triangular, ellipse, polygon, etc., can also be utilized to achieve the objects of the present invention.

Fifth Embodiment

Figure 11:
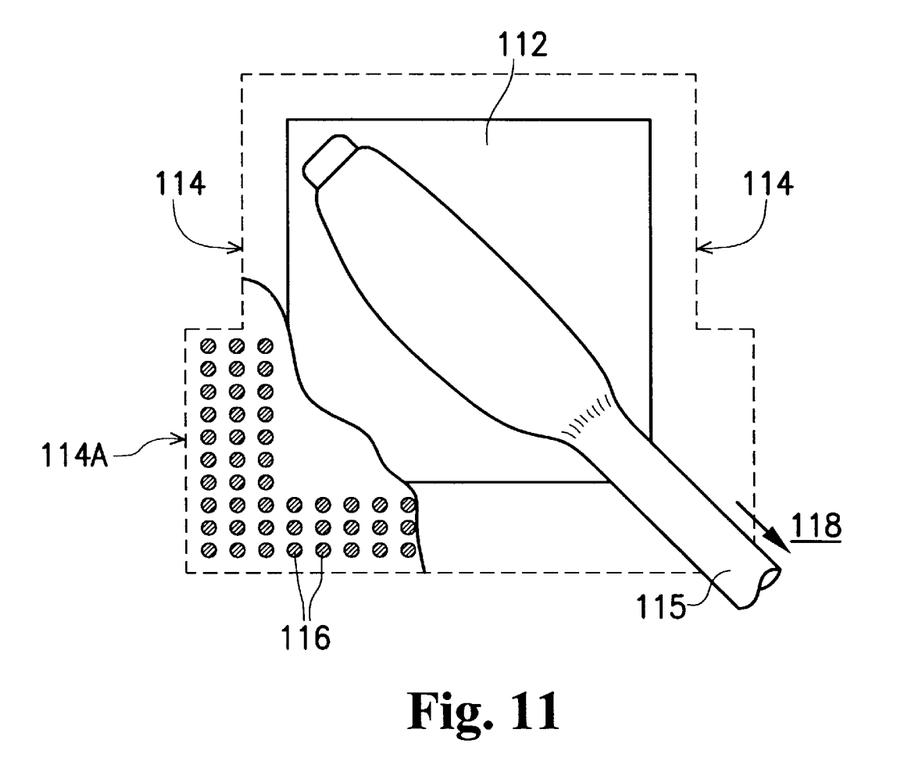
FIG. 11 schematically depicts the fifth preferred embodiment in accordance with the present invention after bonding in a top view.
Figure 12:
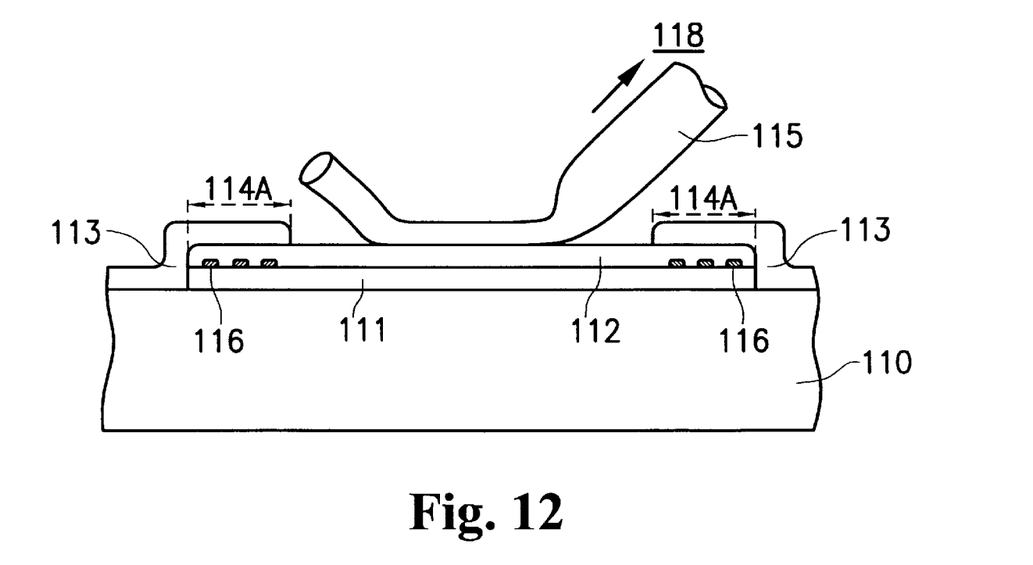
FIG. 12 schematically depicts a cross-sectional view of FIG. 11.

Referring to FIG. 11, the fifth preferred embodiment in accordance with the present invention after bonding is schematically depicted in a top view. Moreover, FIG. 12 is a cross-sectional view of FIG. 11. The bonding pad shown in FIGS. 11 and 12 is formed over a semiconductor substrate 110, in which lots of devices (not shown in the drawing) have been fabricated.

For isolation between a subsequently-formed conducting pad 112 and the devices fabricated in the semiconductor substrate 110, an insulating layer 111 is formed on the semiconductor substrate 110. The insulating layer 111 is further in charge of planarization, the thickness of which should be sufficient, and which is usually made of borophosphosilicate glass (BPSG). A buffer layer is thereafter formed on the insulating layer 111, and, preferably, the buffer layer may be an undoped polysilicon layer deposited in a low-pressure chemical vapor deposition (LPCVD) reactor. Then, by means of photolithography, the buffer layer is patterned and etched to shape a plurality of islands 116 positioned within the range of a wider overhang region 114A (which will be described in the following).

Next, the conducting pad 112 is deposited to cover the insulating layer 111 as well as the islands 116. The conducting pad 114 is preferably a metal layer made of multi-layer material of TiN/Al—Si—Cu/TiN/Ti, which serves the function of transmitting an input signal or an output signal, or tying to a power level or a ground level, etc. Reference numeral 113 designates a passivation layer overlying the semiconductor substrate 110 to prevent scratches or cracking in the internal circuitry. The passivation layer 113 is partially etched away to expose a portion of the conducting pad 112 for wedge bonding. Accordingly, the overhang region between the conducting pad 112 and the passivation layer 113 is referred to numeral 114 in the drawing.

Usually, during bonding, one end of a conducting line 115 made, for example, of aluminum filaments, is bonded to the exposed portion of the conducting pad 112 by a wedge bonder. However, another end is drawn in a direction 118 as shown in FIG. 11 and tied to one bond finger of a lead frame (not shown in the drawing) so as to electrically connect the bonding pad to the associated bond finger. Note that a portion of the overhang region 114 close to the drawing direction 118 is wider than the other portion thereof and referred to reference numeral 114A.

In the fifth preferred embodiment, there are several islands 116 merely positioned between the insulating layer 111 and conducting pad 112 within the range of the wider overhang region 114A. Accordingly, even if misalignment occurs, while the conducting line 115 is bonded, peeling resistance ability can be increased via a form of mechanical interlocking. In addition, the wider portion 114A enhances the adhesion between the conducting pad 112 and the passivation layer 113. Preferably, those islands 116 have a diameter of from about 0.5 μm to several micrometers, whereas the spacing among the islands 116 is greater than 0.5 μm. Although circles as shown in FIG. 11 exemplify the islands 116, other shapes such as rectangular, square, triangular, ellipse, polygon, etc., can also be utilized to achieve the objects of the present invention.

Sixth Embodiment

Figure 13:
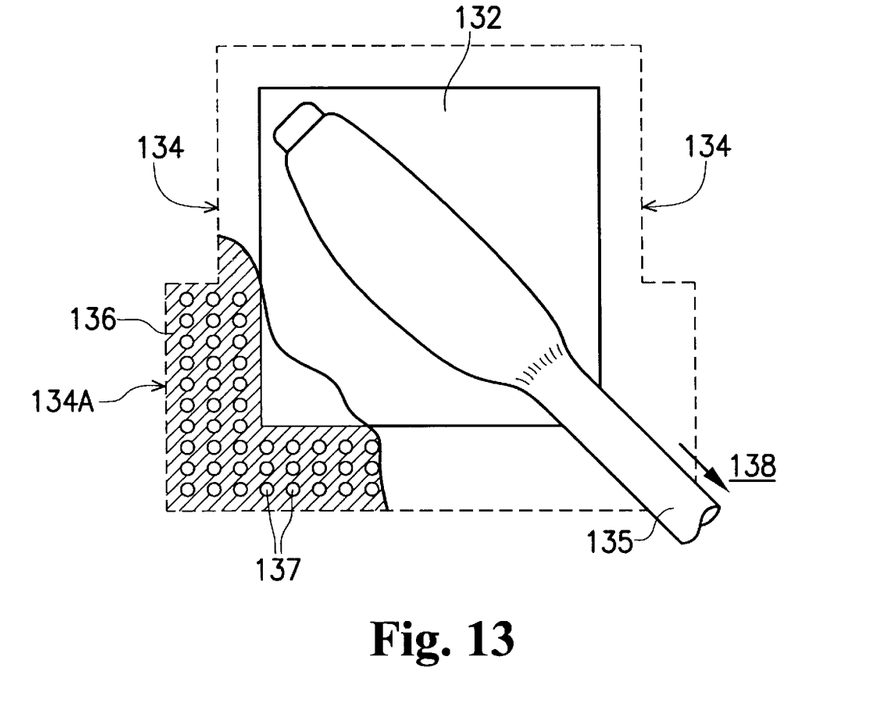
FIG. 13 schematically depicts the sixth preferred embodiment in accordance with the present invention after bonding in a top view.
Figure 14:
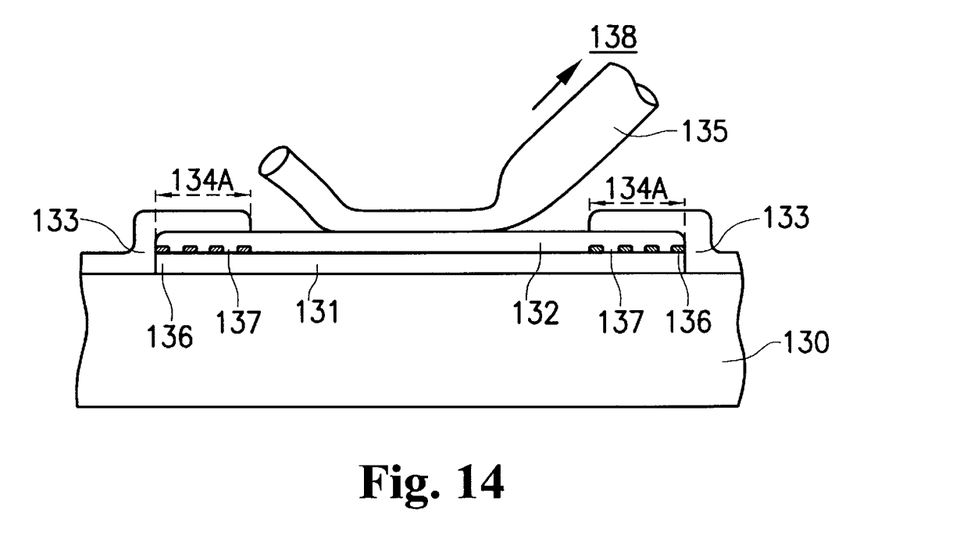
FIG. 14 schematically depicts a cross-sectional view of FIG. 13.

Referring to FIG. 13, the sixth preferred embodiment in accordance with the present invention after bonding is schematically depicted in a top view. Moreover, FIG. 14 is a cross-sectional view of FIG. 13. The bonding pad shown in FIGS. 13 and 14 is formed over a semiconductor substrate 130, in which lots of devices (not shown in the drawing) have been fabricated.

For isolation between a subsequently-formed conducting pad 132 and the devices fabricated in the semiconductor substrate 130, an insulating layer 131 is formed on the semiconductor substrate 130. The insulating layer 131 is further in charge of planarization, the thickness of which should be sufficient, and which is usually made of borophosphosilicate glass (BPSG). A buffer layer 136 is thereafter formed on the insulating layer 131, and, preferably, the buffer layer 136 may be an undoped polysilicon layer deposited in a low-pressure chemical vapor deposition (LPCVD) reactor. Then, by means of photolithography, the buffer layer 136 is patterned and etched to shape a plurality of openings 137 positioned within the range of an wider overhang region 134A (which will be described in the following).

Next, the conducting pad 132 is deposited to cover the insulating layer 131 as well as the buffer layer 136, and therefore filled in the openings 137. The conducting pad 132 is preferably a metal layer made of multi-layer material of TiN/Al—Si—Cu/TiN/Ti, which serves the function of transmitting an input signal or an output signal, or tying to a power level or a ground level, etc. Reference numeral 133 designates a passivation layer overlying the semiconductor substrate 130 to prevent scratches or cracking in the internal circuitry. The passivation layer 133 is partially etched away to expose a portion of the conducting pad 132 for wedge bonding. Accordingly, the overhang region between the conducting pad 132 and the passivation layer 133 is referred to numeral 134 in the drawing.

Usually, during bonding, one end of a conducting line 135 made, for example, of aluminum filaments, is bonded to the exposed portion of the conducting pad 132 by a wedge bonder. However, another end is drawn in a direction 138 as shown in FIG. 13 and tied to one bond finger of a lead frame (not shown in the drawing) so as to electrically connect the bonding pad to the associated bond finger. Note that a portion of the overhang region 134 close to the drawing direction 138 is wider than the other portion thereof and referred to reference numeral 134A.

In the sixth preferred embodiment, there is a buffer layer 136 formed between the insulating layer 131 and conducting pad 132 within the range of the wider overhang region 134A. The buffer layer 136 is dimpled to shape the openings 137 and the conducting pad 132 is made to fill in those openings 137. Accordingly, even if misalignment occurs, while the conducting line 135 is bonded, peeling resistance ability can be increased via a form of mechanical interlocking. In addition, the wider portion 134A enhances the adhesion between the conducting pad 132 and the passivation layer 133. Preferably, those openings 137 have a diameter of from about 0.5 μm to several micrometers, whereas the spacing among the openings 137 is greater than 0.5 μm. Although circles as shown in FIG. 13 exemplify the openings 137, other shapes such as rectangular, square, triangular, ellipse, polygon, etc., can also be utilized to achieve the objects of the present invention.

In conclusion, the present invention discloses several preferred embodiments suited to the input pads, output pads, I/O pads, power pads, ground pads. The islands or openings are positioned between the conducting pad and the insulating layer within the overhang region. By means of mechanical interlocking, the ability for peeling resistance can be increased. In addition, the width of a portion of the overhang region close to the drawing direction may be increased so that the adhesion between the conducting pad and the passivation layer can be intensified.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, to practice various other embodiments, and to make various modifications suited to the particular use contemplated. It is intended that the scope of the invention be defined by the following claims and their equivalents.

What is claimed is:

1. A bonding pad structure formed on a semiconductor substrate, comprising:

an insulating layer formed on said semiconductor substrate;

a plurality of islands directly formed on said insulating layer;

a conducting pad directly in contact with said insulating layer and said islands to interlock mechanically therewith; and a passivation layer overlying peripherals of said conducting pad to form an overhang region therebetween;

wherein said islands are merely positioned beneath said overhang region.

2. The bonding pad structure as claimed in claim 1, wherein said islands are made of polysilicon.

3. The bonding pad structure as claimed in claim 1, wherein said insulating layer is a borophosphosilicate glass (BPSG) layer.

4. The bonding pad structure as claimed in claim 1, wherein said conducting pad is a metal layer.

5. The bonding pad structure as claimed in claim 1, wherein said passivation layer is a silicon-oxynitride layer.

6. A bonding pad structure formed on a semiconductor substrate, comprising:

an insulating layer formed on said semiconductor substrate;

a dimpled buffer layer directly formed on said insulating layer;

a conducting pad directly in contact with said insulating layer and said dimpled buffer layer to interlock mechanically therewith; and a passivation layer overlying peripherals of said conducting pad to form an overhang region therebetween;

wherein said dimpled buffer layer is merely formed beneath said overhang region.

7. The bonding pad structure as claimed in claim 6, wherein said buffer layer is a polysilicon layer.

8. The bonding pad structure as claimed in claim 6, wherein said insulating layer is a borophosphosilicate glass (BPSG) layer.

9. The bonding pad structure as claimed in claim 6, wherein said conducting pad is a metal layer.

10. The bonding pad structure as claimed in claim 6, wherein said passivation layer is a silicon-oxynitride layer.

11. A bonding pad structure formed on a semiconductor substrate for bonding with a conducting line drawn in a direction, comprising:

an insulating layer formed on said semiconductor substrate;

a conducting pad formed on said insulating layer; and a passivation layer overlying peripherals of said conducting pad to have an overhang region therebetween, wherein a portion of said overhang region close to said drawing direction has a width greater than other portion thereof.

12. The bonding pad structure as claimed in claim 11, further comprising a plurality of island formed between said insulting layer and said conducting pad within the range of said wider overhang region so as to mechanically interlock with said conducting pad.

13. The bonding pad structure as claimed in claim 12, wherein said islands are made of polysilicon.

14. The bonding pad structure as claimed in claim 11, further comprising a plurality of islands formed between said insulting layer and said conducting pad with the overall range of said overhang region so as to mechanically interlock with said conducting pad.

15. The bonding pad structure as claimed in claim 14, wherein said islands are made of polysilicon.

16. The bonding pad structure as claimed in claim 11, further comprising a dimpled buffer layer formed between said insulating layer and said conducting pad within the range of said wider overhang region so as to mechanically interlock with said conducting pad.

17. The bonding pad structure as claimed in claim 16, wherein said buffer layer is a polysilicon layer.

18. The bonding pad structure as claimed in claim 11, further comprising a dimpled buffer layer formed between said insulating layer and said conducting layer within the overall range of said overhang region so as to mechanically interlock with said conducting pad.

19. The bonding pad structure as claimed in claim 18, wherein said buffer layer is a polysilicon layer.

20. The bonding pad structure as claimed in claim 11, wherein said insulating layer is a borophosphosilicate glass (BPSG) layer.

21. The bonding pad structure as claimed in claim 11, wherein said conducting pad a metal layer.

22. The bonding pad structure as claimed in claim 11, wherein said passivation layer is a silicon-oxynitride layer.

* * * * *